(12) United States Patent
Murakami et al.

(10) Patent No.: US 7,573,743 B2
(45) Date of Patent: Aug. 11, 2009

(54) SEMICONDUCTOR DEVICE AND CONTROL METHOD OF THE SAME

(75) Inventors: Hiroki Murakami, Kanagawa (JP); Kazuhiro Kurihara, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 310 days.

(21) Appl. No.: 11/514,391

(22) Filed: Aug. 30, 2006

(65) Prior Publication Data

US 2007/0047369 A1    Mar. 1, 2007

Related U.S. Application Data

(63) Continuation-in-part of application No. PCT/JP2005/015695, filed on Aug. 30, 2005.

(51) Int. Cl.
*G11C 11/34* (2006.01)
(52) U.S. Cl. .............. 365/185.11; 365/185.29; 365/185.33
(58) Field of Classification Search ............ 365/185.29, 365/185.3, 218, 185.11, 185.33
See application file for complete search history.

(56) References Cited

U.S. PATENT DOCUMENTS

| | | | |
|---|---|---|---|
| 5,245,570 A | 9/1993 | Fazio et al. ............... 365/185 |
| 5,563,828 A * | 10/1996 | Hasbun et al. ......... 365/185.33 |
| 6,023,423 A * | 2/2000 | Aritome ................ 365/185.11 |
| 2003/0090941 A1* | 5/2003 | Harari et al. ........... 365/185.29 |

FOREIGN PATENT DOCUMENTS

| | | |
|---|---|---|
| JP | 7169288 | 7/1995 |
| JP | 2000076116 | 3/2000 |

* cited by examiner

*Primary Examiner*—Vu A Le
*Assistant Examiner*—Han Yang (57) ABSTRACT

A semiconductor device includes: a first sector (12) having data that are all to be erased and having flash memory cells; a second sector (14) having data that are all to be retained and having flash memory cells; a sector select circuit (16) selecting a pair of sectors from among sectors during erasing the data in the first sector, said pair of sectors being the first sector and the second sector; and an SRAM array (storage) (30) retaining the data of the second sector. The present invention can provide a semiconductor device in which a reduced number of sector select circuits is used so that the area of memory cell array can be reduced and provide a method of controlling the semiconductor device.

10 Claims, 10 Drawing Sheets

SEMICONDUCTOR DEVICE AND CONTROL METHOD OF THE SAME

CROSS-REFERENCES TO RELATED APPLICATIONS

This is a continuation in part of International Application No. PCT/JP2005/015695, filed Aug. 30, 2005 which was not published in English under PCT Article 21(2).

TECHNICAL FIELD

This invention generally relates to a semiconductor device and its control method, and more particularly, to a semiconductor device having a non-volatile memory and a method for controlling the semiconductor device.

DESCRIPTION OF THE RELATED ART

BACKGROUND

Recently, non-volatile memories that are electrically erasable and programmable semiconductor devices have been widely utilized. Flash memories are typical non-volatile memories and are equipped with a memory cell transistor having a charge storage layer, which is called floating gate or insulation layer. Data can be stored by trapping charge in the charge storage layer. Data can be erased by applying a high voltage between a control gate above the charge storage layer and the substrate. An FN tunnel current flows through a tunnel oxide film located between the charge storage layer and the substrate, so that the charge can be drawn from the charge storage layer. Erasing of data can be implemented by a small amount of current, and a number of memory cells can be simultaneously involved in erasing of data.

Figure 1:
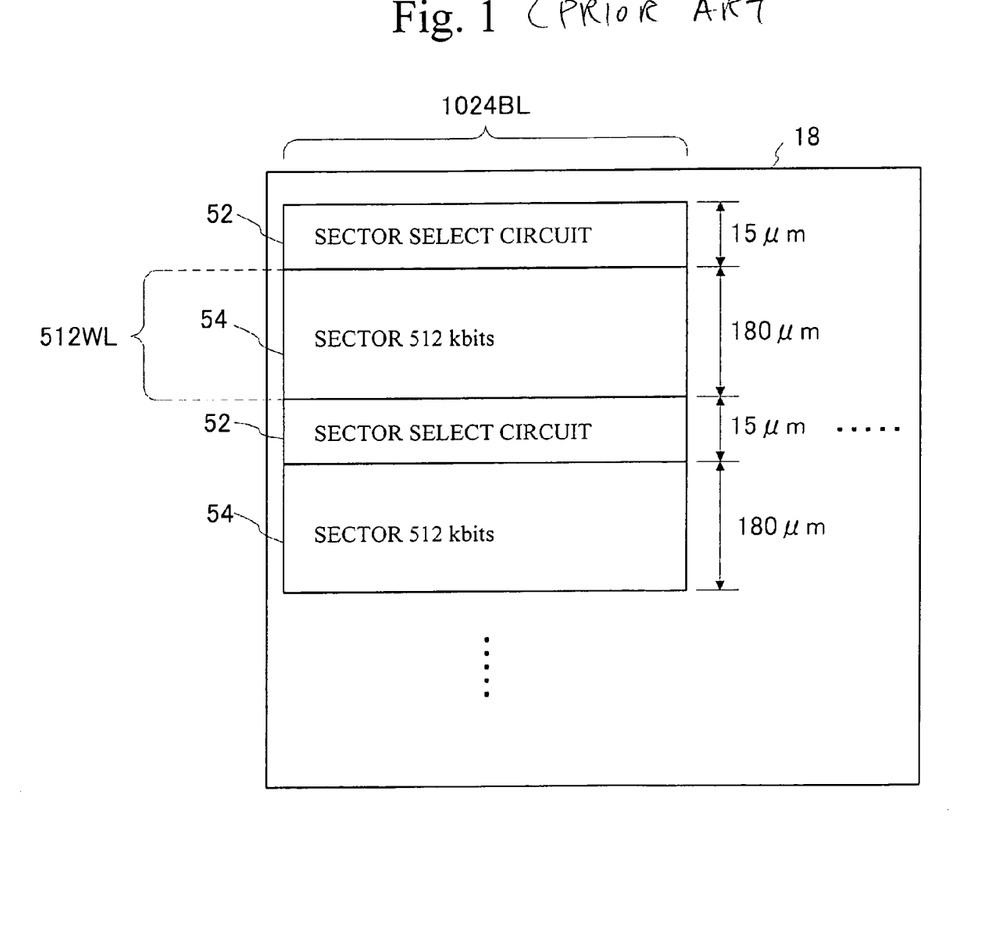
FIG. 1 (PRIOR ART) is a schematic diagram of a memory cell array of a flash memory in accordance with a first related art.

A 128 Mbit NOR flash memory will now be described as first related art. FIG. 1 (PRIOR ART) shows a memory cell array 18 of the NOR flash memory. The memory cell array 18 has 256 sectors. One sector 54 has 1024 bit lines BL that run in the transverse direction, and 512 word lines WL that run in the longitudinal direction. One sector 54 has memory cells equal to 512 kbits and arranged in rows and columns. One sector is the unit for simultaneous data erasing. Sector select circuits 52 are arranged close to the sectors 54, and select the sectors 54 to be subjected to data erase.

Japanese Patent Application Publication No. 2000-76116 discloses another art (second related art) in which a sector has multiple small blocks. Data stored in small blocks other than specific small blocks from which data are not erased are transferred to a storage. After the data in the sector is erased, the data stored in the storage is returned to the original address area.

The first related art requires each of the sector select circuits 52 for the respective one of the sectors 54. The flash memory of the second related art is intended to erase data quickly and requires one sector select circuit for one sector.

SUMMARY OF THE INVENTION

This Summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

It is an object of the present invention to provide a semiconductor device in which a reduced number of sector select circuits is used so that the area of the memory cell array can be reduced and to provide a method of controlling the semiconductor device.

According to an aspect of the present invention, there is provided a semiconductor device including: a first sector having data that are all to be erased and having flash memory cells; a second sector having data that are all to be retained and having flash memory cells; a sector select circuit selecting a pair of sectors from among sectors during erasing the data in the first sector, said pair of sectors being the first sector and the second sector; and a storage retaining the data of the second sector. With this structure, the sector select circuit is provided for the pair of sectors, so that the number of sector select circuits can be reduced and the area of the memory cell array can be reduced.

The semiconductor devices of the invention may further include a control circuit that writes data stored in the second sector into the storage, erases data in the first sector and the second sector, and writes data stored in the storage into the second sector. The data in the first data can be erased without erasing the data in the second sector even for the improved arrangement in which one sector select circuit is arranged for every two sectors.

The semiconductor device of the invention may further include: a read circuit that reads data from the second sector for retaining the data in the storage; and a storage write circuit that receives the data from the read circuit, and writes the data into the storage. The present invention is capable of writing data in the second sector into the storage without temporarily outputting the data to an outside of the memory device.

The semiconductor device of the invention may further include: a storage read circuit that reads data from the storage for writing the data into the second sector; and a write circuit that receives the data from the storage read circuit, and writes the data into the second sector. The present invention is capable of writing data into the second sector without temporarily outputting the data in the storage to an outside of the memory device.

The semiconductor device of the invention may be configured so that a storage capacity of the first sector is substantially the same as that of the second sector. With this structure, the storage can be efficiently utilized.

The semiconductor device may be configured so that the storage capacities of the first storage and the second storage are substantially the same as a storage capacity of the storage. With this structure, the area of the storage can be reduced.

The semiconductor device may further include: a main bit line connected to the sectors via the sector select circuit; and a sub bit line commonly provided to the first and second sectors and connected to the non-volatile memory cells of the first and second sectors, the sector select circuit including a select transistor that selectively making a connection of the sub bit line with the main bit line. With this structure, the sector select circuit for selecting the first and second sectors from among the sectors can be simplified.

The semiconductor device may be configured so that the non-volatile memory cells are flash memory cells.

According to another aspect of the present invention, there is provided a method of controlling a semiconductor device including: writing data stored in a second sector having flash memory cells into a storage; erasing data in a first sector having flash memory cells and the data the second sector; and writing the data stored in the storage into the second sector. The data in the first sector can be erased without erasing the data in the second sector even for the unique arrangement in which the sector selecting circuit is provided commonly for the first and second sectors.

The method may be configured so that erasing the data includes selecting a pair of sectors from among sectors, said a pair of sectors being the first sector and the second sector.

BRIEF DESCRIPTION OF THE DRAWINGS

Other objects, features and advantages of the present invention will become more apparent from the following detailed description when read in conjunction with the accompanying drawings, in which.

DETAILED DESCRIPTION

Reference will now be made in detail to embodiments of the present claimed subject matter, examples of which are illustrated in the accompanying drawings. While the claimed subject matter will be described in conjunction with these embodiments, it will be understood that they are not intended to limit the claimed subject matter to these embodiments. On the contrary, the claimed subject matter is intended to cover alternatives, modifications and equivalents, which may be included within the spirit and scope of the claimed subject matter as defined by the appended claims. Furthermore, in the following detailed description of the present claimed subject matter, numerous specific details are set forth in order to provide a thorough understanding of the present claimed subject matter. However, it will be evident to one of ordinary skill in the art that the present claimed subject matter may be practiced without these specific details. In other instances, well known methods, procedures, components, and circuits have not been described in detail as not to unnecessarily obscure aspects of the claimed subject matter.

A description will now be given of embodiments of the present invention with reference to the accompanying drawings.

First Embodiment

Figure 2:
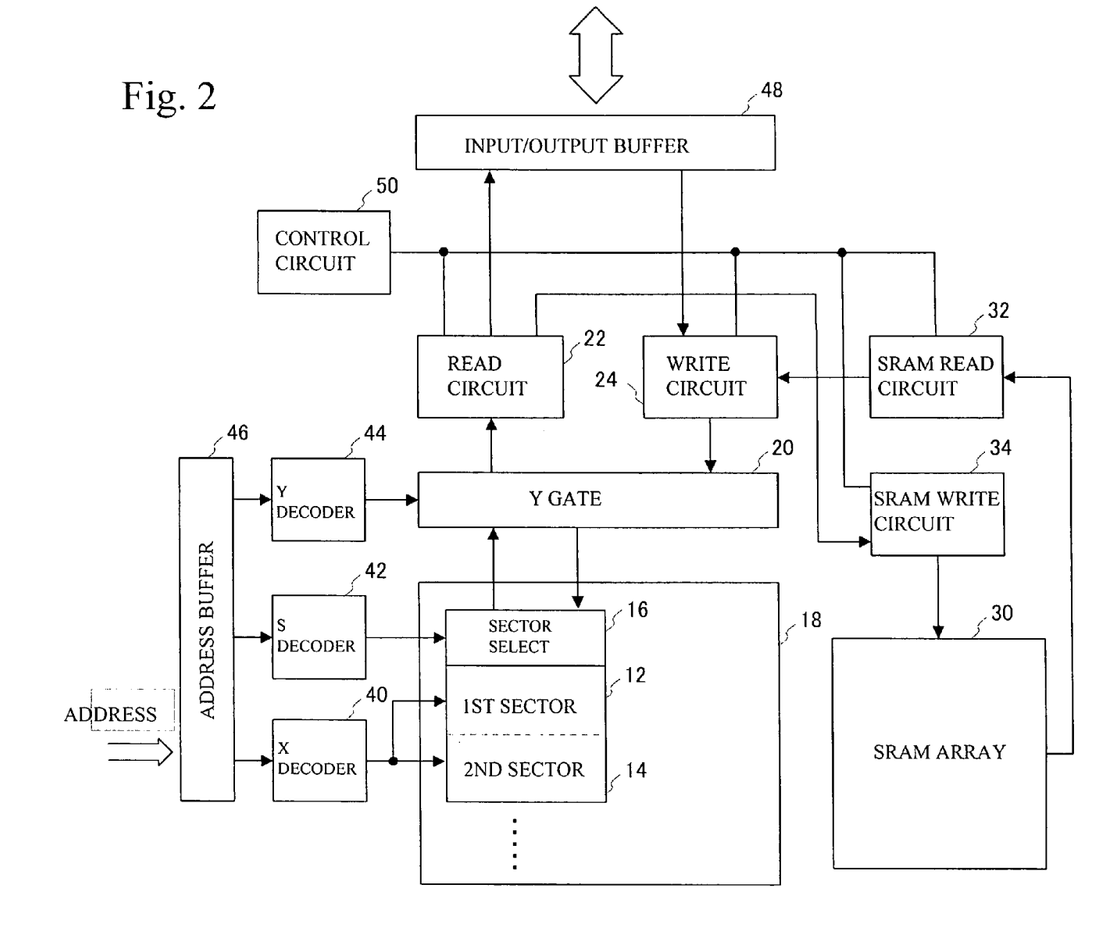
FIG. 2 is a block diagram of a flash memory in accordance with a first embodiment.

A first embodiment is an exemplary 128 Mbit NOR flash memory. FIG. 2 is a block diagram of a flash memory in accordance with the first embodiment. Referring to FIG. 2, the memory cell array 18 of the flash memory has 256 sectors 12 and 14. Each of the sectors 12 and 14 has flash memory cells equal to 512 kbits. A sector select circuit 16 is provided for a set of two sectors 12 and 14. Thus, the memory cell array 18 has 128 sector select circuits 16. Now, the two sectors 12 and 14 selectable by the associated sector select circuit 16 are defined as first sector 12 and the second sector 14.

When data reading/writing/erasing for the memory cells of the first and second sectors 12 and 14 is carried out, an address held in an address buffer 46 is applied to an X decoder 40, an S decoder 42 and a Y decoder 44. The X decoder 40 selects word lines of the first and second sectors 12 and 14. The S decoder 42 causes the sector select circuit 16 to select two sectors from among the multiple sectors at the time of erasing data in the first and second sectors 12 and 14. The Y decoder 44 causes an Y gate 20 to select bit lines. A voltage for erasing is simultaneously applied to the two selected sectors. The bit lines connected to the first and second sectors 12 and 14 are connected to a read circuit 22 and a write circuit 24 through the Y gate 20. The Y gate 20 selects bit lines in accordance with instructions from the Y decoder 44.

The read circuit 22 reads data in the memory cells of the first and second sectors 12 and 14, and includes a cascode circuit and a sense amplifier. The write circuit 24 writes data in the memory cells of the first and second sectors 12 and 14, and data latch circuits. An input/output buffer 48 is used to transfer data externally applied to the write circuit 24 and receive data to be externally output from the read circuit 22.

Further, the flash memory of the first embodiment has an SRAM array 30 (a storage). The SRAM array 30 retains the data in the first sector 12 or the second sector 14 at the time of erasing data from the first and second sectors 12 and 14. An SRAM write circuit 34 receives data from the read circuit 22, and writes the data into the SRAM array 30. The SRAM read circuit 32 reads data from the SRAM array 30, and outputs the data to the write circuit 24. The SRAM array 30 may have a storage capacity of, for example, 512 kbits. A control circuit 50 controls transfers of data between the read circuit 22, the write circuit 24, the SRAM read circuit 32 and the SRAM write circuit 34.

Figure 3:
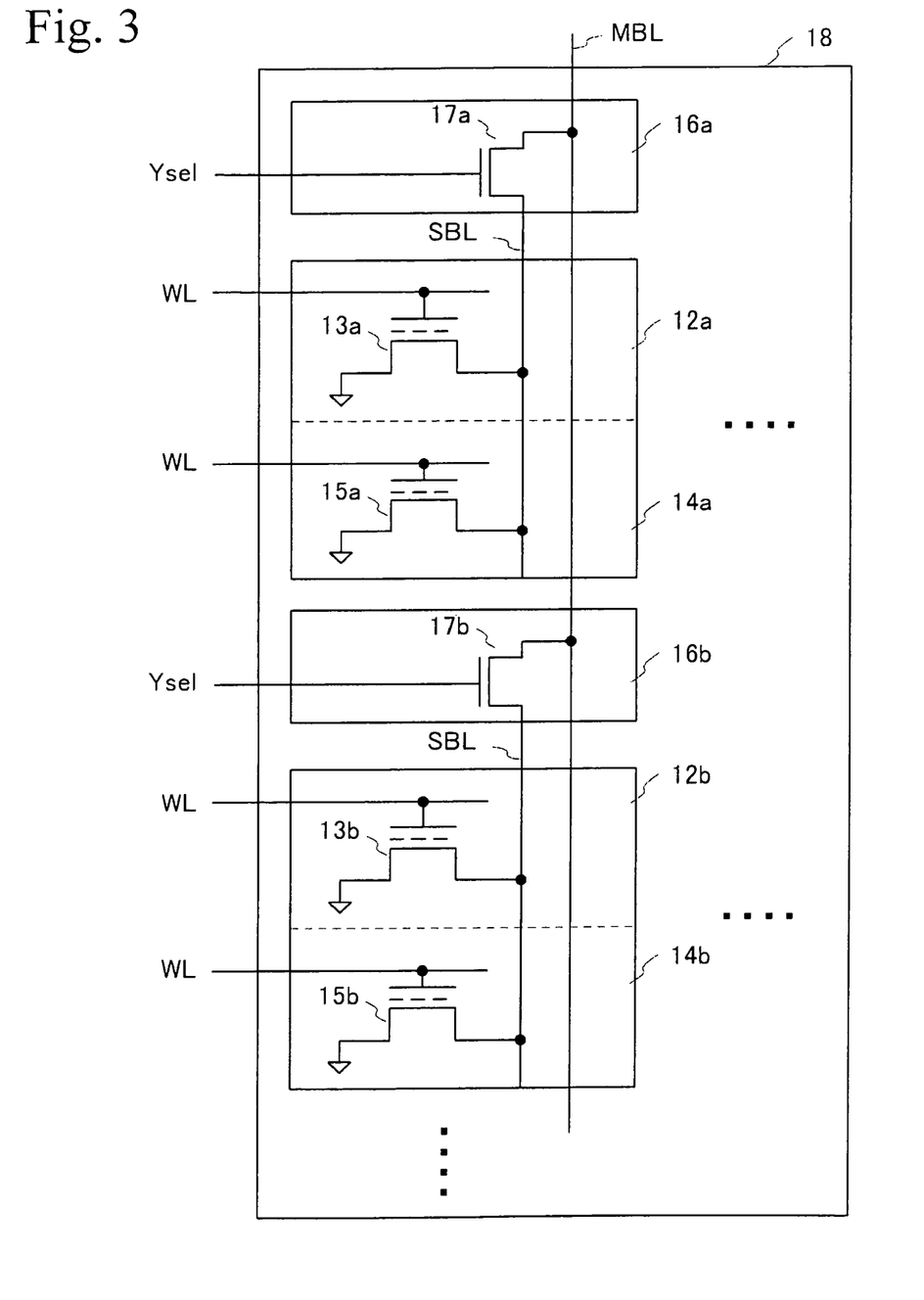
FIG. 3 is a schematic circuit diagram of a memory cell array of the flash memory of the first embodiment.

FIG. 3 is a schematic circuit diagram of the memory cell array 18 in the flash memory of the first embodiment. The memory cell array 18 has 256 sectors 12a, 12b, 14a and 14b. The sectors 12a, 12b, 14a and 14b are respectively equipped with groups of memory cells 13a, 13b, 15a and 15b, each group being equal to 512 kbits. A sector select circuit 16a is provided for every two sectors 12a and 14a, and a sector select circuit 16b is provided for every two sectors 12b and 14b. A main bit line MBL of memory cell array 18 runs in the longitudinal direction of the drawing. The main bit line MBL is coupled to the read circuit 22 and the write circuit 24 via the Y gate 20 shown in FIG. 2. The sector select circuit 16a includes a select FET 17a, which connects a sub bit line SBL to the main bit line MBL. The gate of the select FET 17a is connected to Ysel of the S decoder 42 shown in FIG. 2. The select FET 17a selectively connects the sub bit line SBL to the main bit line MBL in accordance with the output of the S decoder 42. To each sub bit line SBL, connected are the drain of the memory cell 13a in the first selector 12a and the drain of the memory cell 15a in the second sector 14a. The gates of the memory cells 13a and 14a are connected to word lines WL, and the sources thereof are connected to source lines. Further, 1024 sub bit lines SBL and 512 word lines are connected to each of the sectors 12a and 14a. In the above-mentioned manner, memory cells equal to 512 kbits 13a are arranged in the sector 12a, and memory cells equal to 512 kbits 15a are arranged in the sector 14a. The sector select circuit 16b, the first sector 12b, the second sector 14b, the select FET 16b and the memory cells 13b and 15b are configured as mentioned above, and a detailed description thereof will be omitted here.

Figure 4:
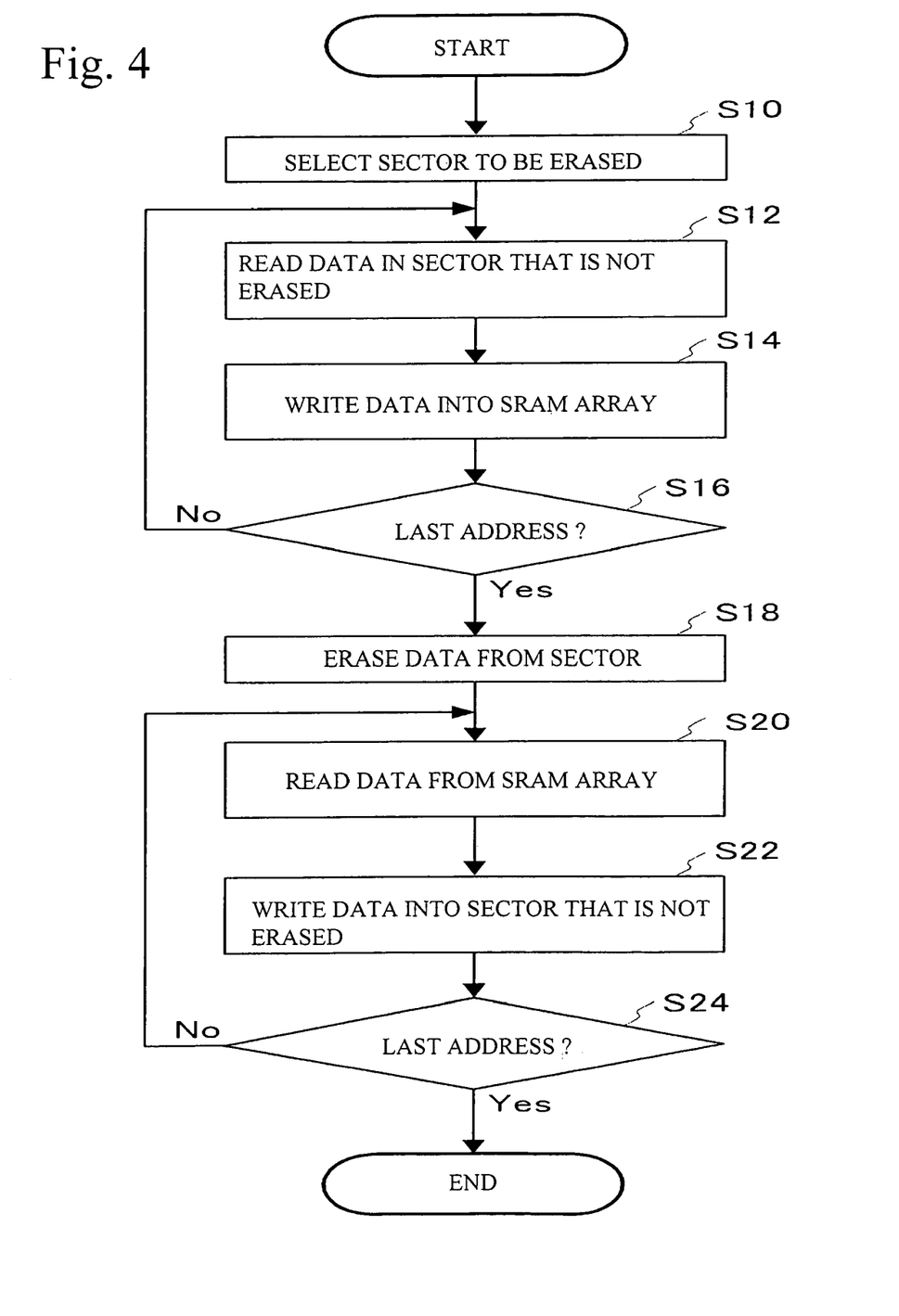
FIG. 4 is a flowchart of data erasing in the flash memory of the first embodiment.

A description will now be given, with reference to FIGS. 4, 5A, 5B and 5C, of an operation in which data in the first sector 12a is erased. FIG. 4 is a flowchart of this operation, and FIGS. 5A, 5B and 5C show the first sector 12a, the second sector 14a, the sector select circuit 16a and the SRAM array 30.

Figure 5A:
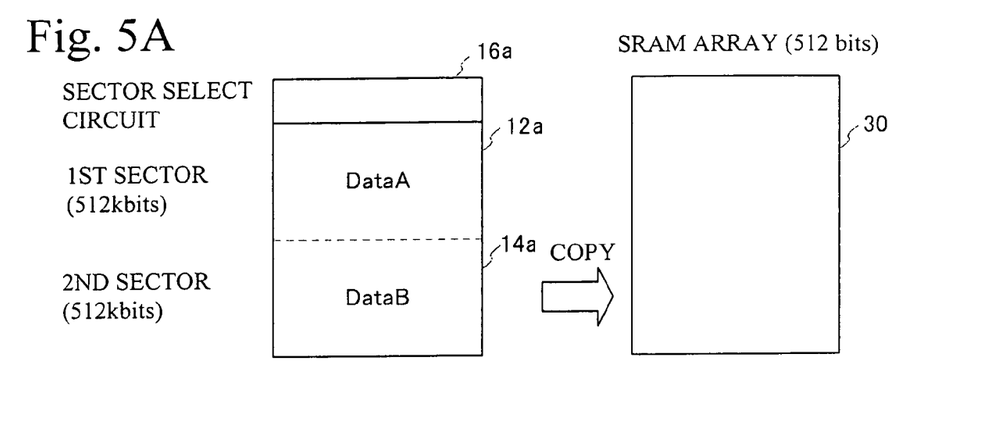
FIGS. 5A through 5C are schematic diagrams of the memory cell array for describing data erasing in the flash memory of the first embodiment.
Figure 5B:
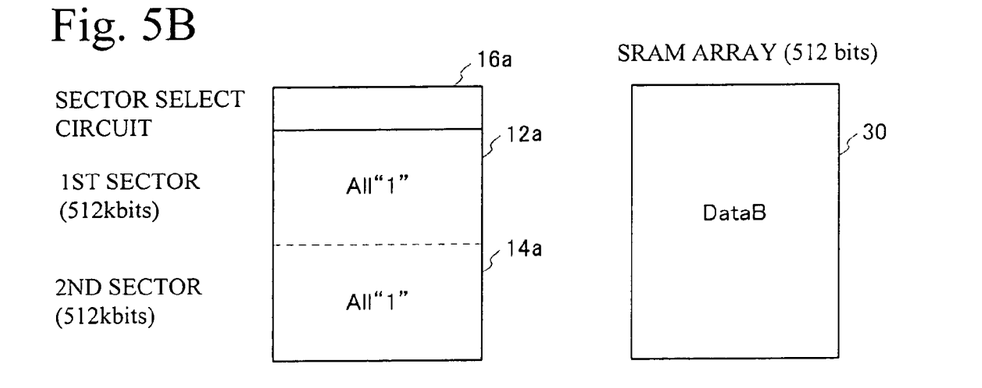
Figure 5C:
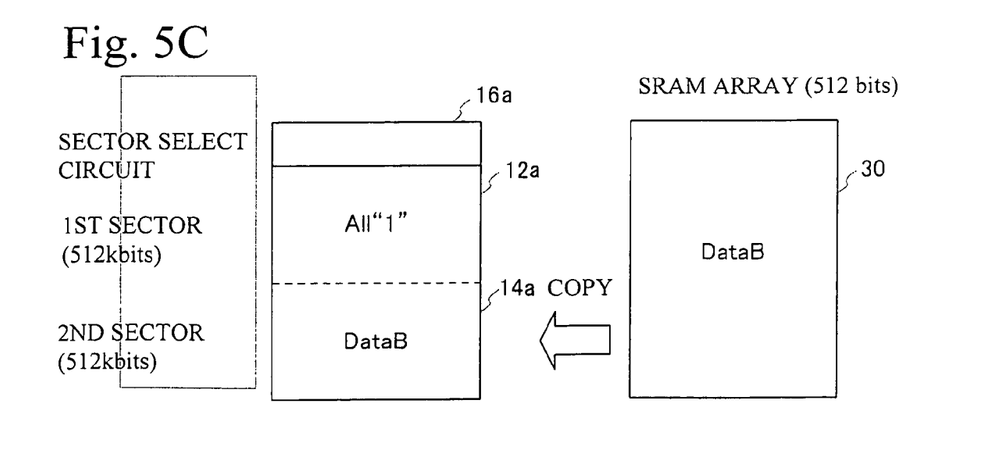

Referring to FIG. 5A, data DataA of 512 kbits have been written into the first sector 12a, and data DataB of 512 kbits have been written into the second sector 14a. The SRAM array 30 has a storage capacity of 512 kbits. A copy of the data DataB in the second sector 14a is made and written into the SRAM array 30. Turning back to FIG. 4, the S decoder 42 selects, as sectors from which data should be erased, two sectors of the first sector 12a and the second sector 14a from among the 256 sectors in the memory cell array 18, and selects the sector select circuit 16a (step S10). The control circuit 50 causes the read circuit 22 to read data stored in the memory cells indicated by a selected address of the second sector 14a (step S12). The control circuit 50 causes the read circuit 22 to send the read data to the SRAM write circuit 34, and causes the SRAM write circuit 34 to write the data into memory cells in the SRAM array 30 indicated by a corresponding address (step S14). The control circuit 50 confirms whether the current address is the last address of the second sector 14a (step S16). When the current address is the last address, the process proceeds to step S18. When the current address is not the last address, the process returns to step S12, and the next address is subjected by the processes of steps S12 and S14. In this manner, a copy of the data in the second sector 14a accessible by addresses equal to 512 kbits is made and written into the memory cells of the SRAM array 30. Referring to FIG. 5B, data DataB in the second sector 14a equal to 512 kbits are written into the SRAM array 30 and are retained therein.

Next, the data in the first and second sectors 12a and 14a are all erased (step S18). Referring to FIG. 5B, data in the first and second sectors 12a and 14a are all "1". This means that all data have been erased. Turning back to FIG. 4, the control circuit 50 causes the SRAM read circuit 32 to read data in the memory cells specified by an address of the SRAM array 30 (step S20). The control circuit 50 causes the SRAM read circuit 32 to output the read data to the write circuit 24 and causes the write circuit 24 to write the data into memory cells of the second sector 14a specified by a corresponding address (step S22). The control circuit 50 confirms whether the current address is the last address (step S24). When the current address is the last address, the process ends. If not, the process returns to step S20, and data of the next address is processed at steps S20 and S22. In this manner, a copy of the data in the memory cells of the SRAM array 30 specified by the addresses equal to 512 kbits is formed in the second sector 14a. Referring to FIG. 5C, a copy of data DataB held in the SRAM array 30 is formed in the second sector 14a, so that the data of the second sector 14a can be turned to the original prior to erasing of data DataA in the first sector 12a.

Similarly, when data in the second sector 14a are erased, a copy of DataA in the first sector 12a is formed in the SRAM array 30, and data in the first and second sectors 12a and 14a are all erased. Thereafter, a copy of DataA in the SRAM array 30 is formed in the first sector 12a. This allows data in the second data 14a to be erased. When data are erased from sectors other than the first and second sectors 12a and 14a, the S decoder 42 selects the corresponding sector select circuit. Thus, data can be erased from the selected sectors.

The flash memory of the first embodiment has two sectors having flash memory cells, namely, the first sector 12a and the second sector 14a. All data are erased from one of the sectors, for example, the sector 12a, and all data are retained in the other sector, for example, the sector 14a. At the time of erasing the data in the first sector 12a, the sector select circuit 16a selects two sectors of the first and second sectors 12a and 14a from among the multiple sectors. The SRAM array 30 (the storage) is used to retain the data in the second sector 14a. The sector select circuit 16 is arranged for every two sectors, so that a decreased number of sector select circuits 16 can be used and a reduced area for the memory cell array 18 can be utilized.

The control circuit 50 writes data (DataB) in the second sector 14a into the SRAM array 30 (storage). Then, the control circuit 50 erases the data (DataA and DataB) in the first sector 12a and the second sector 14a, and writes the data (DataB) of the SRAM array 30 into the second sector (12a or 14a). It is thus possible to erase the data of the first sector 12a without erasing the data of the second sector 14a by means of the sector select circuit 16 provided for the two sectors.

The flash memory of the first embodiment includes the read circuit 22 that reads data from the second sector 14a when the data in the second sector 14a is stored in the SRAM array 30 (storage), and the SRAM write circuit 34 (storage write circuit) that receives data from the read circuit 22 and writes the data into the SRAM array 30. It is thus possible to write data of the second sector 14a into the SRAM array 30 without temporarily placing the data in an outside of the flash memory.

The flash memory of the first embodiment includes the SRAM read circuit 32 (storage read circuit) that reads data from the SRAM array 30 at the time of writing the data stored in the SRAM array 30 into the second sector 14a, and the write circuit 24 that receives the data from the SRAM read circuit 32 and write the data into the second sector 14a. It is thus possible to write the data into the second sector 14a without placing the data in the SRAM array 30 in an outside of the flash memory.

The flash memory of the first embodiment includes the main bit lines MBL connected to the multiple sectors 12 and 14 via the sector select circuit 16a, and sub bit lines SBL commonly provided to the first and second sectors 12a and 14a and connected to the flash memory cells 13a and 15a of the first and second sectors 12a and 14a. The sector select circuit 16a includes the select FET 17a (select transistor) for selectively connecting the sub bit line SBL to the main bit line MBL. It is thus possible to simply configure the sector select circuit 16a that allows the multiple sectors 12 and 14 to select the first and second sectors 12a and 14a.

Figure 6:
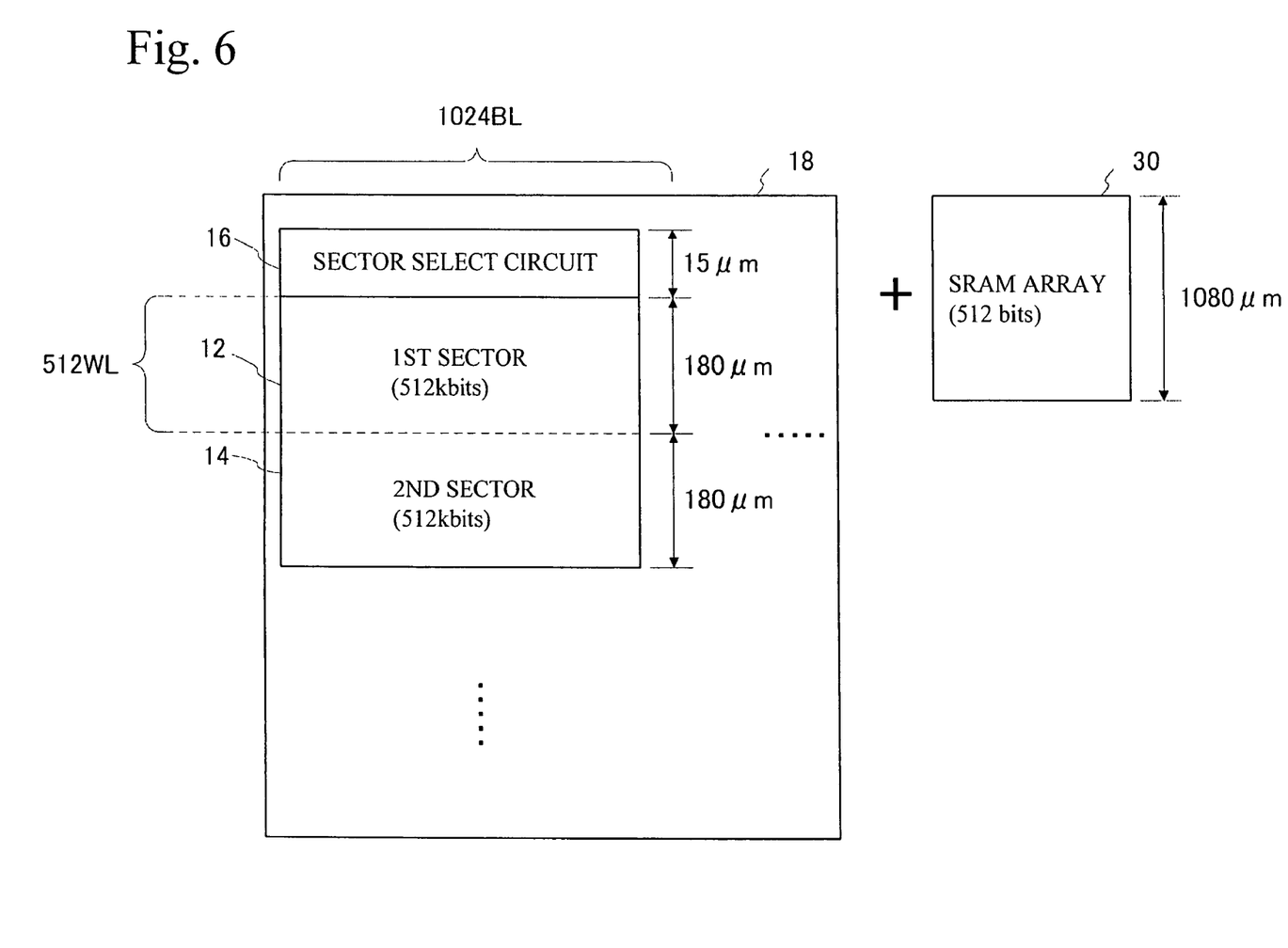
FIG. 6 is a schematic diagram of a memory cell array for explaining effects of area reduction in accordance with the first embodiment.

Now, a description will be given of effects of a reduced area of the memory cell array brought by the use of a reduced number of sector select circuits 16. Referring to FIG. 1, each sector 54 of the first related art is 180 μm wide in the Y direction, and the sector select circuit 52 is 15 μm wide in the Y direction. Referring to FIG. 6, the first sector 12 and the second sector 14 of the first embodiment are 180 μm wide in the Y direction, and the sector select circuits 16 are 15 μm wide in the Y direction. It is known that SRAM needs a chip area for an array of memory cells approximately equal to six times that for an array of NOR flash memory cells. Thus, when it is assumed that the SRAM array 30, the first sector 12 and the second sector 14 are equally long in the X direction, the SRAM array 30 has a width of 1080 μm in the Y direction.

The first embodiment is capable of reducing the width in the Y direction for every two sectors by 15 μm, as compared to the first related art. Thus, the advantages of reduction in the chip area are brought by the first embodiment in cases where the number of sectors included in the memory cell array 18 is equal to or greater than 144 (=1080 μm (the width of SRAM array 30 in the Y direction)/15 μm (the width in the Y direction reducible for every two sectors)×2 (sectors)). The first embodiment has 256 sectors in the memory cell array 18, and provides the effects of chip area reduction.

The first sector 12 and the second sector 14 are not required to have an identical storage capacity. However, in one embodiment, the first sector 12 and the second sector 14 have a substantially identical storage capacity like the first embodiment. It is thus possible to assign an identical memory area in the SRAM array 30 at the time of erasing data from the first sector 12 and erasing data from the second sector 14 and to efficiently utilize the memory area of the SRAM array 30.

The SRAM array 30 is required to have a storage capacity equal to or greater than the greater one of the storage capacities of the first and second sectors 12 and 14. However, in one example, the storage capacities of the first and second sectors (12*a* and 14*a*) are substantially equal to the storage capacity of the SRAM array 30 (equal to 512 kbits). It is thus possible to reduce the chip area of the SRAM array 30.

The NOR flash memories are exemplarily described in the foregoing. However, the present invention includes other types of flash memories such as NAND flash memories. The present invention is not limited to the aforementioned specific specification, namely, a storage capacity of 128 Mbits, a sector size of 512 kbits, and 256 sectors included in the memory cell array 18. The storage is not limited to the SRAM array 30 but may be a memory in which data can be written quickly, such as DRAMs.

Embodiments of the present claimed subject matter generally relates to semiconductor devices. More particularly, embodiments allow semiconductor devices to function with increased efficiency. In one implementation, the claimed subject matter is applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Examplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive nagivation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones).

Flash memory stores information in an array of floating gate transistors, called "cells", each of which traditionally stores one bit of information. However, newer flash memory devices, such as MirrorBit Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit technology has several key advantages. For example, flash memory that utilizes MirrorBit technology are capable of burst-mode access as fast as 80 MHz, page access times as fast as 25 ns, simultaneous read-write operation for combined code and data storage, and low standby power (e.g., 1 μA).

Figure 7:
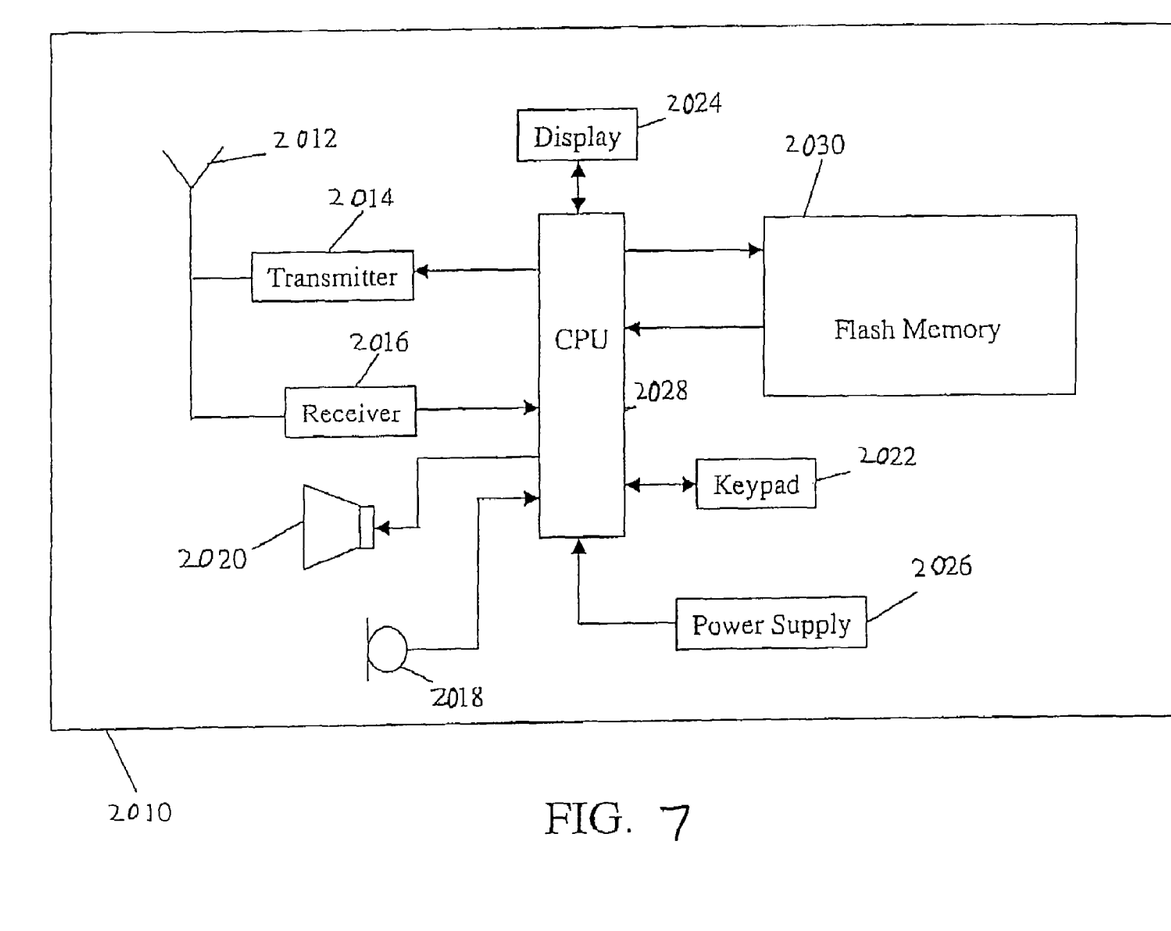
FIG. 7 illustrates a block diagram of a conventional portable phone, upon which embodiments can be implemented.

FIG. 7 shows a block diagram of a conventional portable telephone 2010 (a.k.a. cell phone, cellular phone, mobile phone, internet protocol phone, wireless phone, etc.), upon which embodiments can be implemented. The cell phone 2010 includes an antenna 2012 coupled to a transmitter 2014 a receiver 2016, as well as, a microphone 2018, speaker 2020, keypad 2022, and display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes: a first sector having data that are all to be erased and having flash memory cells; a second sector having data that are all to be retained and having flash memory cells; a sector select circuit selecting a pair of sectors from among sectors during erasing the data in the first sector, said pair of sectors being the first sector and the second sector; and a storage retaining the data of the second sector;

In this way, embodiments allow die size to be reduced. This improvement in flash memory translate into performance improvements in various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps), flash memory requirements have steadily increased. Thus, a more efficient flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 8:
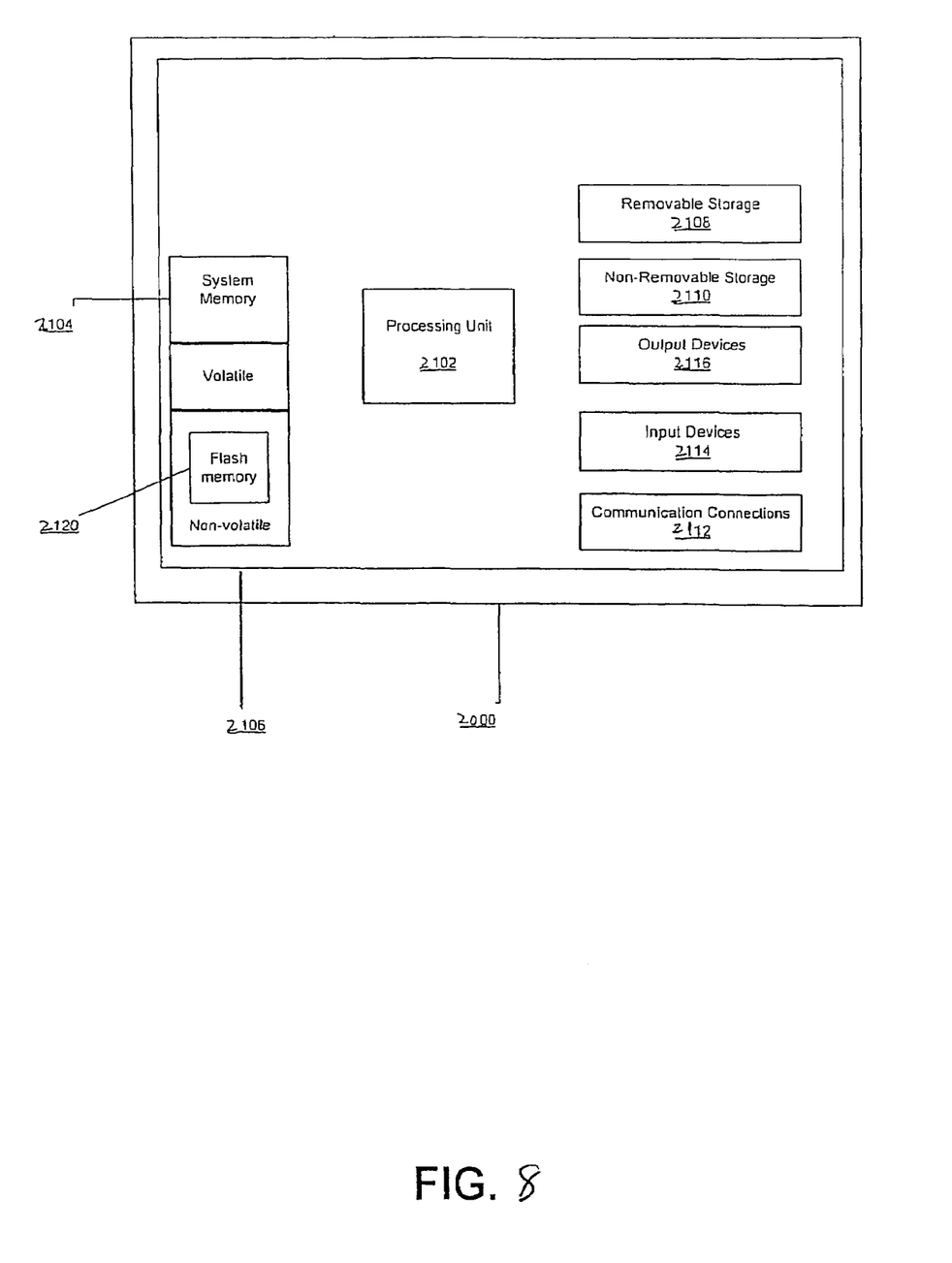
FIG. 8 illustrates a block diagram of a computing device, upon which embodiments of the present claimed subject matter can be implemented.

FIG. 8 illustrates a block diagram of a computing device 2100, upon which embodiments of the present claimed subject matter can be implemented. Although computing device 2100 is shown and described in FIG. 8 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 8.

Also, it is important to note that the computing device 2100 can be a variety of things. For example, computing device 2100 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounters frequent physical impacts. Also, flash memory is more able than other types of memory to withstand intense physical pressure and/or heat. And thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 8 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Video Disc (DVD) recorder, the removable storage is a DVD receiving component utilized to receive and read DVDs. Such additional storage is illustrated in FIG. 8 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: a first sector having data that are all to be erased and having flash memory cells; a second sector having data that are all to be retained and having flash memory cells; a sector select circuit selecting a pair of sectors from among sectors during erasing the data in the first sector, said pair of sectors being the first sector and the second sector; and a storage retaining the data of the second sector;

In this way, embodiments allow die size to be reduced. This improvement in flash memory translate into performance improvements in various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

Further, in one embodiment, the flash memory 2120 utilizes mirrorbit technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well know in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Also, users would also benefit from reduced memory read time.

Figure 9:
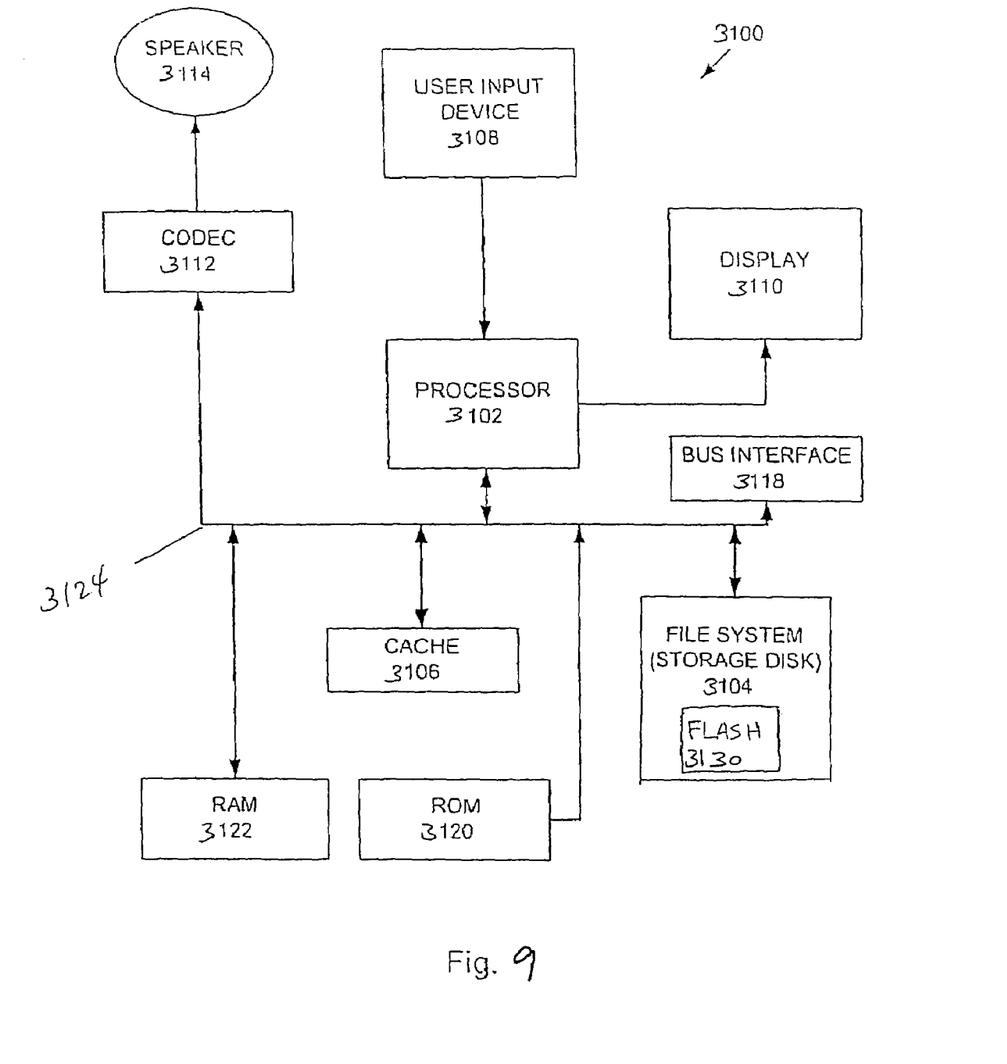
FIG. 9 illustrates an exemplary portable multimedia device, or media player, in accordance with an embodiment of the present claimed subject matter.

FIG. 9 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage disk or a plurality of disks. The file system 3104 typically provides high capacity storage capability for the media player 3100. Also, file system 3104 includes flash memory 3130. In the present embodiment, the flash memory 3130 comprises: a first sector having data that are all to be erased and having flash memory cells; a second sector having data that are all to be retained and having flash memory cells; a sector select circuit selecting a pair of sectors from among sectors during erasing the data in the first sector, said pair of sectors being the first sector and the second sector; and a storage retaining the data of the second sector;

In this way, embodiments allow die size to be reduced. This improvement in flash memory translate into performance improvements in various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3120 and a Read-Only Memory (ROM) 3122. The ROM 3122 can store programs, utilities or processes to be executed in a non-volatile manner. The RAM 3120 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3110. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs) in the file system 3104. When a user desires to have the media player play a particular media item, a list of available media assets is displayed on the display 3110. Then, using the user input device 3108, a user can select one of the available media assets. The processor 3102, upon receiving a selection of a particular media item, supplies the media data (e.g., audio file) for the particular media item to a coder/decoder (CODEC) 3110. The CODEC 3110 then produces analog output signals for a speaker 3114. The speaker 3114 can be a speaker internal to the media player 3100 or external to the media player 3100. For example, headphones or earphones that connect to the media player 3100 would be considered an external speaker.

For example, in a particular embodiment, the available media assets are arranged in a hierarchical manner based upon a selected number and type of groupings appropriate to the available media assets. For example, in the case where the media player 3100 is an MP3 type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

Figure 10:
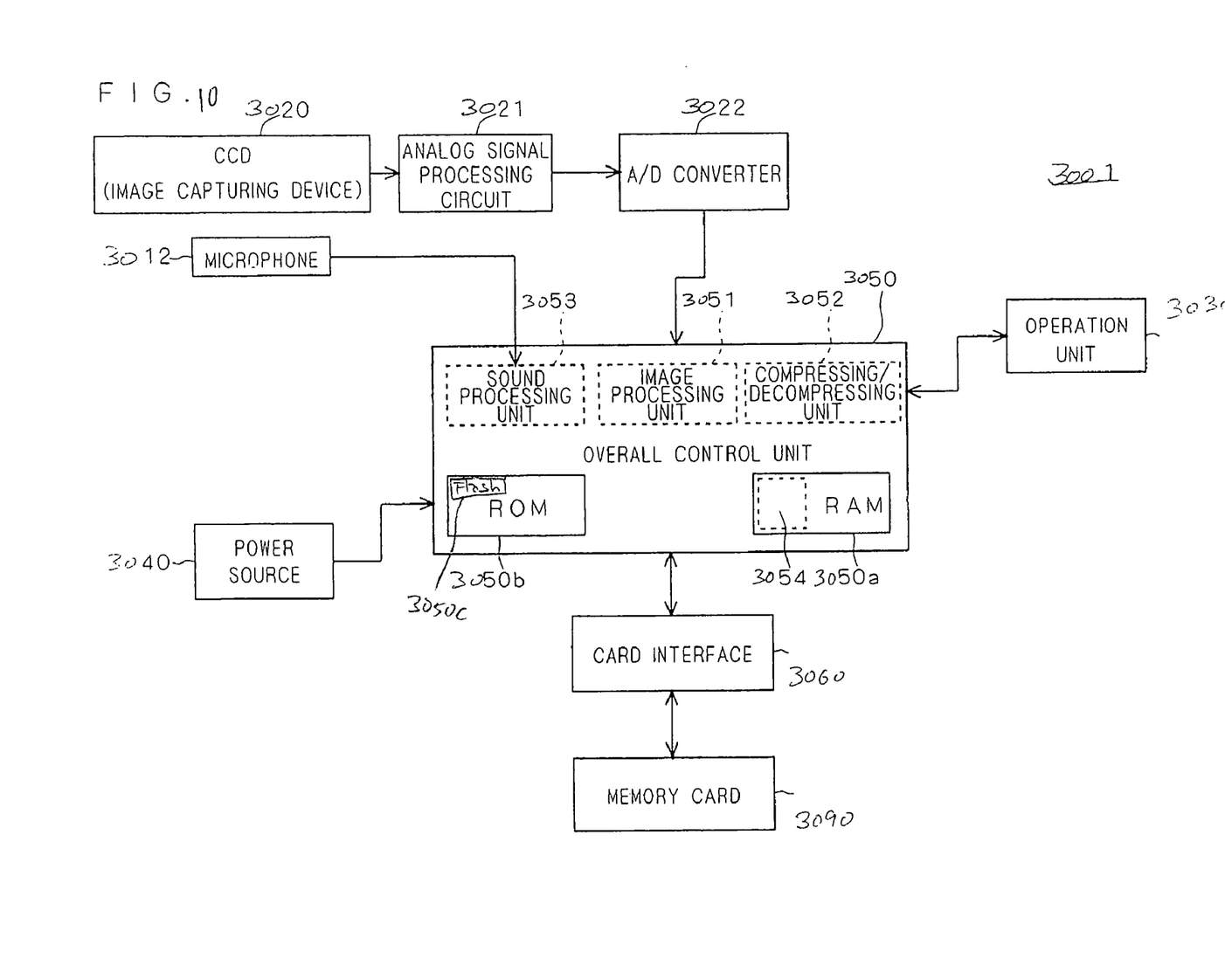
FIG. 10 illustrates an exemplary digital camera, in accordance with an embodiment of the present claimed subject matter.

Referring to FIG. 10, the internal configuration of a digital camera 3001 is described. FIG. 10 is a block diagram showing the internal functions of the digital camera 3001. The CCD (image capturing device) 3020 functions as image capturing means for capturing a subject image and generating an electronic image signal and has, for example, 1600 times 1200 pixels. The CCD 3020 photoelectrically converts a light image of the subject formed by the taking lens into image signals (signal made of a signal sequence of pixel signals received by the pixels) of R (red), G (green) and B (blue) pixel by pixel and outputs the image signal.

The image signal obtained from the CCD 3020 is supplied to an analog signal processing circuit 3021. In the analog signal processing circuit 3021, the image signal (analog signal) is subjected to a predetermined analog signal process. The analog signal processing circuit 3021 has a correlated double sampling circuit (CDS) and an automatic gain control circuit (AGC) and adjusts the level of the image signal by performing a process of reducing noise in the image signal by the correlated double sampling circuit and adjusting the gain by the automatic gain control circuit.

An A/D converter 3022 converts each of pixel signals of the image signal into a digital signal of 12 bits. The digital signal obtained by the conversion is temporarily stored as image data in a buffer memory 3054 in a RAM 3050a. The image data stored in the buffer memory 3054 is subjected to WB (white balance) process, gamma correction process, color correction process and the like by an image processing unit 3051 and, after that, the processed signal is subjected to a compressing process or the like by a compressing/decompressing unit 3052.

A sound signal obtained from the microphone 3012 is inputted to a sound processing unit 3053. The sound signal inputted to the sound processing unit 3053 is converted into a digital signal by an A/D converter (not shown) provided in the sound processing unit 3053 and the digital signal is temporarily stored in the buffer memory 3054.

An operation unit is an operation unit that can include a power source button and a shutter release button and is used when the user performs an operation of changing a setting state of the digital camera 3001 and an image capturing operation.

A power source 3040 is a power supply source of the digital camera 3001. The digital camera 3001 is driven by using a secondary battery such as a lithium ion battery as the power source battery BT.

An overall control unit 3050 is constructed by a microcomputer having therein the RAM 3050a and a ROM 3050b. When the microcomputer executes a predetermined program, the overall control unit 3050 functions as a controller for controlling the above-described components in a centralized manner. The overall control unit 3050 also controls, for example, a live view display process and a process of recording data to a memory card. The RAM 3050a is a semiconductor memory (such as DRAM) which can be accessed at high speed and the ROM 3050b takes the form of, for example, an electrically-rewritable nonvolatile semiconductor memory (such as flash ROM 3050c). A flash memory, in one embodiment, includes: a first sector having data that are all to be erased and having flash memory cells; a second sector having data that are all to be retained and having flash memory cells; a sector select circuit selecting a pair of sectors from among sectors during erasing the data in the first sector, said pair of sectors being the first sector and the second sector; and a storage retaining the data of the second sector;

In this way, embodiments allow die size to be reduced. This improvement in flash memory translate into performance improvements in various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

An area as a part of the RAM 3050a functions as a buffer area for temporary storing data. This buffer area is referred to as the buffer memory 3054. The buffer memory 3054 temporarily stores image data and sound data.

The overall control unit 3050 has the image processing unit 3051, compressing/decompressing unit 3052 and sound processing unit 3053. The processing units 3051, 3052 and 3053 are function parts realized when the microcomputer executes a predetermined program.

The image processing unit 3051 is a processing unit for performing various digital imaging processes such as WB process and gamma correcting process. The WB process is a process of shifting the level of each of the color components of R, G and B and adjusting color balance. The gamma correcting process is a process of correcting the tone of pixel data. The compressing/decompressing unit 3052 is a processing unit for performing an image data compressing process and an image data decompressing process. As the compressing method, for example, the JPEG method is employed. The sound processing unit 3053 is a processing unit for performing various digital processes on sound data.

A card interface (I/F) 3060 is an interface for writing/reading image data to/from the memory card 3090 inserted into the insertion port in the side face of the digital camera 1. At the time of reading/writing image data from/to the memory card 3090, the process of compressing or decompressing image data is performed according to, for example, the JPEG method in the compressing/decompressing unit 3052, and image data is transmitted/received between the buffer memory 3054 and the memory card 3090 via the card interface 3060. Also at the time of reading/writing sound data, sound data is transmitted/received between the buffer memory 3054 and the memory card 3090 via the card interface 3060.

Further, by using the card interface 3060, the digital camera 3001 transmits/receives data such as an image and sound and, in addition, can load a program which operates on the digital camera 3001. For example, a control program recorded on the memory card 3090 can be loaded into the RAM 3050a or ROM 3050b of the overall control unit 3050. In such a manner, the control program can be updated.

Also by communication with an external device (such as an external computer) via a USB terminal, various data such as an image and sound and a control program can be transmitted/received. For example, various data, a program, and the like recorded on a recording medium (CD-R/RW or CD-ROM) which is set into a reader (optical drive device or the like) of the external computer can be obtained via the USB terminal.

Various embodiments of the present invention have been described. The present invention is not limited to these embodiments, but various variations and modifications may be made within the scope of the present invention as claimed.

What is claimed is:

1. A semiconductor device comprising:
a first sector having data that are all to be erased and having flash memory cells;
a second sector having data that are all to be retained and having flash memory cells;
a sector select circuit selecting a pair of sectors from among sectors during erasing the data in the first sector, said pair of sectors being the first sector and the second sector; and
a storage retaining the data of the second sector, wherein the data of the second sector is stored prior to erasing of the pair of sectors.

2. The semiconductor devices as claimed in claim 1, further comprising a control circuit that writes data stored in the second sector into the storage, erases data in the first sector and the second sector, and writes data stored in the storage into the second sector.

3. The semiconductor device as claimed in claim 2, further comprising:
a read circuit that reads data from the second sector for retaining the data in the storage; and
a storage write circuit that receives the data from the read circuit, and writes the data into the storage.

4. The semiconductor device as claimed in claims 2, further comprising:
a storage read circuit that reads data from the storage for writing the data into the second sector; and
a write circuit that receives the data from the storage read circuit, and writes the data into the second sector.

5. The semiconductor device as claimed in claim 1, wherein a storage capacity of the first sector is substantially the same as that of the second sector.

6. The semiconductor device as claimed in claim 5, wherein the storage capacities of the first storage and the second storage are substantially the same as a storage capacity of the storage.

7. The semiconductor device as claimed in claim 1, further comprising:
a main bit line connected to the sectors via the sector select circuit; and
a sub bit line commonly provided to the first and second sectors and connected to the non-volatile memory cells of the first and second sectors,
the sector select circuit including a select transistor that selectively making a connection of the sub bit line with the main bit line.

8. The semiconductor device as claimed in claim 1, wherein the non-volatile memory cells are flash memory cells.

9. A method of controlling a semiconductor device comprising:
writing data stored in a second sector having flash memory cells into a storage;
erasing data in a first sector having flash memory cells and the data the second sector, wherein the erasing of data in the first sector and the second sector is performed after the writing of data in the second sector into the storage; and
writing the data stored in the storage into the second sector.

10. The method as claimed in claims 9, wherein erasing the data includes selecting a pair of sectors from among sectors, said a pair of sectors being the first sector and the second sector.

* * * * *